United States Patent
Kapon et al.

(10) Patent No.: US 6,507,595 B1
(45) Date of Patent: Jan. 14, 2003

(54) VERTICAL-CAVITY SURFACE-EMITTING LASER COMPRISED OF SINGLE LASER ELEMENTS ARRANGED ON A COMMON SUBSTRATE

(75) Inventors: Elyahou Kapon, Lausanne (CH); Fabrice Monti di Sopra, Zürich (CH); Marcel Brunner, Zürich (CH)

(73) Assignee: Avalon Photonics, Zurich (CH)

( * ) Notice: Subject to any disclaimer, the term of this patent is extended or adjusted under 35 U.S.C. 154(b) by 50 days.

(21) Appl. No.: 09/715,597

(22) Filed: Nov. 17, 2000

(30) Foreign Application Priority Data

Nov. 22, 1999 (EP) .............................. 99123311

(51) Int. Cl.$^7$ .............................. H01S 5/00; H01S 3/08; H01S 3/082; H01L 27/15

(52) U.S. Cl. .............................. 372/45; 372/43; 372/96; 372/97; 257/81

(58) Field of Search .............................. 372/45, 92, 96, 372/43, 28, 97; 257/81

(56) References Cited

U.S. PATENT DOCUMENTS

| | | | | |
|---|---|---|---|---|
| 5,258,316 A | | 11/1993 | Ackley et al. ................. | 437/24 |
| 5,444,731 A | * | 8/1995 | Pfister ......................... | 372/99 |
| 6,144,682 A | * | 11/2000 | Sun ............................. | 372/45 |
| 6,259,121 B1 | * | 7/2001 | Lemoff et al. ................. | 257/88 |
| 6,365,427 B1 | * | 4/2002 | Gauggel et al. ............... | 438/22 |

OTHER PUBLICATIONS

High–power coherently coupled 8×8 vertical cavity surface emitting laser array, MOrgan et al, Applied Physics Letters, pp. 1160–1162, Sep. 1992, No. 10.*

R.A. Morgan, K. Kojima, T. Mullally, G.D. Guth, M.W. Focht, R.E. Leibenguth, and M. Asom, High–Power Coherently Coupled 8×8 Vertical Cavity Surface Emitting Laser Array, Appl. Phys. Lett. 61, Sep. 7, 1992, pp. 1160–1162.

D.G. Deppe, J.P. van der Ziel, Naresh Chand, G.J. Zydzik, and S.N.G. Chu, Phase–Coupled Two–Dimensional $Al_xGa_{1-x}As$–GaAs Vertical–Cavity Surface–Emitting Laser Array, Appl. Phys. Lett. 56, May 21, 1990, pp. 2089–2091.

Xuefei Tang, Jan P. van der Ziel, Fellow IEEE, Bing Chang, Ralph Johnson, Member IEEE, and Jim A. Tatum, Observation of Bistability in GaAs Quantum–Well Vertical–Cavity Surface–Emitting Lasers, Journal of Antum Electronics, 3 pages.

European Search Report for EP 99 12 3311, May 25, 2000, 3 pages.

* cited by examiner

Primary Examiner—Quyen Leung
Assistant Examiner—Armando Rodriguez
(74) Attorney, Agent, or Firm—Moser, Patterson & Sheridan

(57) ABSTRACT

A vertical-cavity surface-emitting laser device (VCSEL) comprises a plurality of VCSEL elements arranged on a common substrate, each VCSEL element comprising first mirror means and second mirror means, each having a predefined reflectivity at a predetermined wavelength, for forming an optical resonator for said wavelength, and a laser active region disposed between said first and second mirror means. In addition, the VCSEL device comprises a grid layer having a plurality of openings corresponding to the respective VCSEL elements and a contact layer having a predetermined thickness, said contact layer being interposed between each of said first mirror means and said grid layer, wherein an optical thickness of said contact layer and a reflectivity and an absorption of said grid layer is selected so as to provide an effective reflectivity of each of said first mirror means depending on said grid layer and being different for areas covered by the grid and areas corresponding to said grid openings.

19 Claims, 4 Drawing Sheets

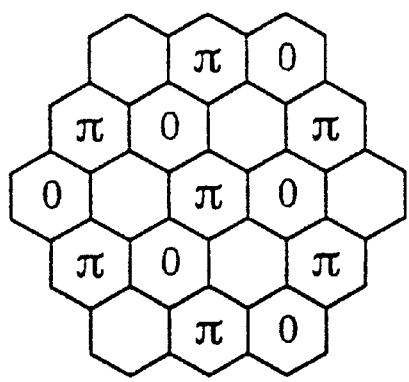
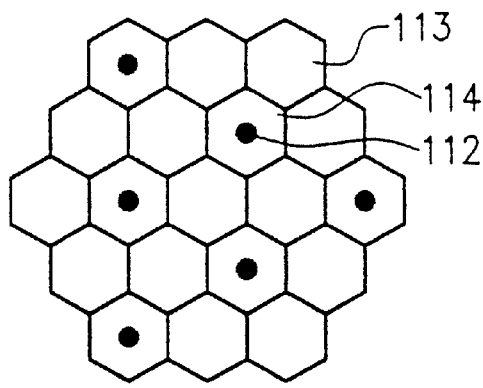
FIG. 4a
FIG. 4b
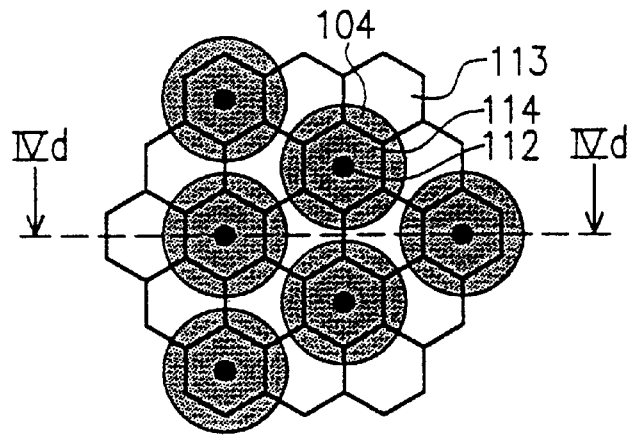
FIG. 4c
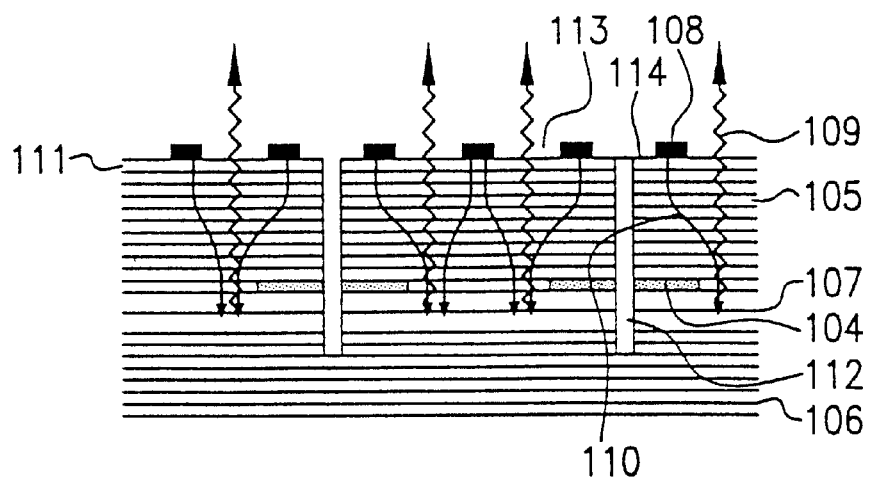
FIG. 4d

VERTICAL-CAVITY SURFACE-EMITTING LASER COMPRISED OF SINGLE LASER ELEMENTS ARRANGED ON A COMMON SUBSTRATE

The present invention relates to a vertical-cavity surface-emitting laser (VCSEL) device comprising a plurality of VCSEL elements arranged on a common substrate, each VCSEL element comprising first mirror means having a first reflectivity and second mirror means having a second reflectivity at a predetermined wavelength for forming an optical resonator for said wavelength, and a laser active region disposed between said first and second mirror means.

Semiconductor laser devices steadily gain in importance in a plurality of industrial applications. In particular, in the fields of gas spectroscopy, coupling of laser light into optical fibers, and in communication systems where a high transmission rate is required, semiconductor laser devices with high spectral purity, i.e. with single mode output radiation in the longitudinal as well as the transverse directions, are highly desirable. Especially, vertical-cavity surface-emitting lasers (VCSEL) represent an important development, since the possibility of manufacturing a large plurality of such laser devices on a single semiconductor substrate provides laser devices with high efficiency and low power consumption in conjunction with low manufacturing costs. These laser devices inherently lase in a single longitudinal mode due to their small longitudinal extension of the laser active region (some hundreds of nanometers). When, however, a high output power from a single device is required, the lateral extension of this device has to be increased, thereby reducing the spectral purity of the laser output, since then the beam quality suffers from the competition of many transverse radiation modes. Accordingly, the highest possible single mode output power from a VCSEL is limited (currently the maximum value achieved is 4.8 mW), since the size of the VCSEL must remain small to restrict emission to a single fundamental transverse mode.

In order to achieve increased output power while maintaining a well-defined single transverse mode which is desirable for a variety of applications such as laser printing, material treatment, or optical pumping, so-called "phase coupled arrays" have been developed and investigated during the last years. In such a phase coupled array, usually the top or bottom surface of a laterally widely extending VCSEL is divided into a plurality of laser elements by means of a grid-like structure, typically formed of metal. The thickness of the grid bars separating adjacent laser elements are selected so as to allow the electric fields of adjacent elements to couple to each other. Since, in general, top and bottom distributed Bragg reflectors as well as the laser active region are provided common to all single laser elements, and a current is supplied to the common active region by means of the conductive grid bars, the laser elements are no longer individually addressable. Accordingly, the phase coupled array can also be considered a laterally large VCSEL device emitting in a coherent supermode, wherein the nodes of the electric field are defined by the grid structure on the top or bottom surface of the VCSEL.

In the early 1990's, phase coupled arrays were demonstrated for the first time and, in recent developments, have shown very promising behavior in pulsed operation with more than 500 mW of a single mode peak output power in, for example, an 8×8 array, as disclosed in "Applied Physical Letters" Vol. 61, 1160 (1992).

In order to provide for a phase coupled array in a VCSEL, a variety of possibilities have been practiced in the prior art.

In IEEE "Journal of Quantum Electronics," Vol. 26, No.11, November 1990, a phase coupled array is described having a metal grid inside the cavity defining areas of low reflectivity. Subsequently, a dielectric mirror has been deposited after the formation of the metal grid and this dielectric and serves as the outcoupling mirror of the laser device. This fabrication technology, however, is quite complicated and the device exhibits during operation a mixture of the lowest order and several high order modes, so that this approach does not seem to be very promising.

In "Optics Letters," Vol. 18, No.5, Mar. 1, 1993, a VCSEL is disclosed having a metal grid applied to the top of a complete VCSEL structure, including two semiconductor distributed Bragg reflectors. However, the reflectivity variation induced by the metal grid alone, is too low to stabilize the highest order transverse mode for CW operation.

In "Applied Physical Letters," Vol. 60, 1535, 1992, a bottom emitting VCSEL structure is described, having a semiconductor bottom mirror and a hybrid semiconductor/gold top mirror. The reflectivity of the top mirror is fine-tuned with two different metalizations, wherein highly reflective gold is evaporated on the laser elements, while less reflective TiAu or Cr/Au is used for the grid which defines the individual laser elements. Since no light can escape through the top metals, this technology is only appropriate for bottom emitters.

In "Applied Physical Letters," Vol. 58, 890, 1991,a VCSEL is disclosed, wherein a grid is etched into the top distributed Bragg reflector. According to this technology, no current injection is possible and, hence, the device is merely able to be operated with optical pumping.

It is, therefore, an object of the present invention to provide a VCSEL device having a high output power with a defined single transverse radiation mode, whereby the aforementioned disadvantages of the prior art are avoided.

According to the present invention, there is provided a vertical-cavity surface-emitting laser device comprising a plurality of VCSEL elements arranged on a common substrate, each VCSEL element comprising first mirror means and second mirror means each having a predefined reflectivity at a predetermined wavelength, for forming an optical resonator for said wavelength, a laser active region disposed between said first and second mirror means, and a grid layer arranged over said first mirror means, said grid layer having a plurality of openings corresponding to the respective VCSEL elements, said VCSEL device being characterized in that it comprises a contact layer having a predetermined thickness, said contact layer being interposed between and adjacent to each of said first mirror means and said grid layer, wherein an optical thickness of said contact layer and a reflectivity and an absorption of said grid layer is selected so as to provide an effective reflectivity of each of said first mirror means depending on said grid layer and being different for areas covered by the grid and areas corresponding to said grid openings.

According to the present invention, the employment of the contact layer in combination with the structure of the grid layer, i.e. the geometric structure as well as the composition and the thickness thereof, provides simple means for a significant variation of the reflectivity of the first mirror means. Due to the varying reflectivity along the lateral dimension of the VCSEL device, the loss within the cavity varies accordingly and, hence, a single transverse radiation mode is sufficiently stabilized. Therefore, the VCSEL device of the present invention allows, contrary to the prior art devices which are described to be operated only in a pulsed mode, the operation with constant current and continuous wave (cw) thereby insuringe high continuous output power exhibiting a single transverse radiation mode.

Preferably, said first and second mirror means are provided as Bragg reflectors which are common to all of said VCSEL elements. By this measure, a high density of VCSEL elements may be provided, and, at the same time, the manufacturing process for such a device is considerably simplified. Moreover, manufacturing of such devices is compatible to standard fabrication methods such as selective oxidation, mesa etching, and proton implantation.

Advantageously, the thickness of said contact layer is adjusted such that the reflectivity of said first mirror means is reduced in regions covered by the grid, compared to regions corresponding to said grid openings. An accordingly arranged contact layer and grid layer insure that the reflectivity and, hence, the loss of the resonator in regions corresponding to the portions covered by the grid, is relatively low so that the transverse radiation mode having an intensity minimum at those portions; is significantly stabilized, whereas other transverse radiation modes are remarkably suppressed.

In a preferred embodiment, the thickness of said contact layer is adjusted so as to obtain the minimum reflectivity of said regions covered by said grid layer for a given composition of the first mirror means and said grid layer.

By this measure, the lateral reflectivity contrast reaches a maximum value and, hence, the suppression of undesired transverse radiation modes is maximized.

Preferably, said grid layer comprises more than one layer, each of said layers consisting of a material having a defined index of refraction, a defined absorption coefficient and a defined thickness.

Advantageously, said regions not covered by said grid layer form radiation emission windows for a radiation of said wavelength. In this way, the radiation is output through the opening of the grid layer and the bars of the grid layer additionally serve as an optical aperture.

Preferably, an extension of each of said radiation emission windows is arranged to select substantially a fundamental transverse radiation mode of said radiation with respect to the corresponding VCSEL element. This leads to an arrangement in which the VCSEL device in its entirety emits in the highest order transverse radiation mode (supermode).

Advantageously, the absolute reflectivity of said first and second mirror means including optical characteristics of said contact layer and said grid layer is selected so as to obtain the minimum reflectivity required to generate stimulated emission. Thus, it is guaranteed that the VCSEL device emits a laser beam once a certain current is supplied to the active region.

Preferably, said grid layer comprises at least one metal layer. This allows to use the grid layer concurrently as an electrode for injecting charge carriers into the active region.

Advantageously, an additional dielectric mirror is provided on top of said first mirror means so as to further increase the overall reflectivity of the resonator.

Preferably, said first reflectivity, in the areas covered by the grid, is reduced by at least 3 percent compared to the reflectivity of said areas corresponding to the grid openings.

In a preferred embodiment, said grid layer is a raster of squares or rectangles. In such an arrangement, each pixel can naturally couple to its nearest neighbors 180° out of phase, which leads to emission in the highest order supermode of the device.

Advantageously, a bar width of said grid layer is less than 10 $\mu$m and is preferably less than 5 $\mu$m (typically 1 $\mu$m). An accordingly arranged bar width of said grid layer separating adjacent radiation emission windows allows the electric fields of corresponding adjacent VCSEL elements to sufficiently couple to each other so that a single transverse radiation supermode is maintained. However, with thinner bars, not only the coupling between adjacent VCSELs is stronger but the area coverage of the bars is smaller, thereby making the coupling of the light out of the device more efficient.

Preferably, a maximum dimension of each radiation emission window of each VCSEL element is in the range of 2 $\mu$m to 10 $\mu$m. With these dimensions, the fundamental mode of each VCSEL element is efficiently selected.

In a preferred embodiment, the grid layer is a honeycomb raster and a resistance layer is provided, formed between the first and second mirror means and having at least one region corresponding to an opening of said honeycomb raster with a high electrical resistance and said at least one high resistance region has 6 nearest-neighbor-regions having a low electrical resistance.

Since the highest order supermode requires two adjacent VCSEL elements to emit radiation with a phase difference of 180°, each VCSEL element in the center of 6 surrounding elements in the honeycomb raster does not meet this requirement. By providing said resistance layer which at least covers the area of a central element, the charge carriers flowing through the active region are forced to concentrate in the neighboring VCSEL elements having low electrical resistance. Therefore, although the net current flow remains at the same level, the charge carrier density in the active regions of the VCSEL elements neighboring said central element is increased, thereby increasing the conversion efficiency of these active regions.

Preferably, said high resistance region comprises an exposed portion where at least the overlying layers of the Bragg mirror have a vertical opening. By means of this vertical opening, the high resistance region can easily be manufactured by selective oxidation of a buried layer having a high content of aluminum.

In a further preferred embodiment, a grid matching resistance layer is provided between said one of said mirror means and said laser active region, said grid matching resistance layer having a high electrical resistance at least in regions covered by said grid layer. Since the geometric structure of the grid matching resistance layer matches the geometry of said grid layer, the charge carrier density can be increased in regions where the reflectivity is high and, thus, the optical gain is additionally improved.

In the following, the present invention shall be explained in more detail with reference to the drawings, wherein.

Figure 1:
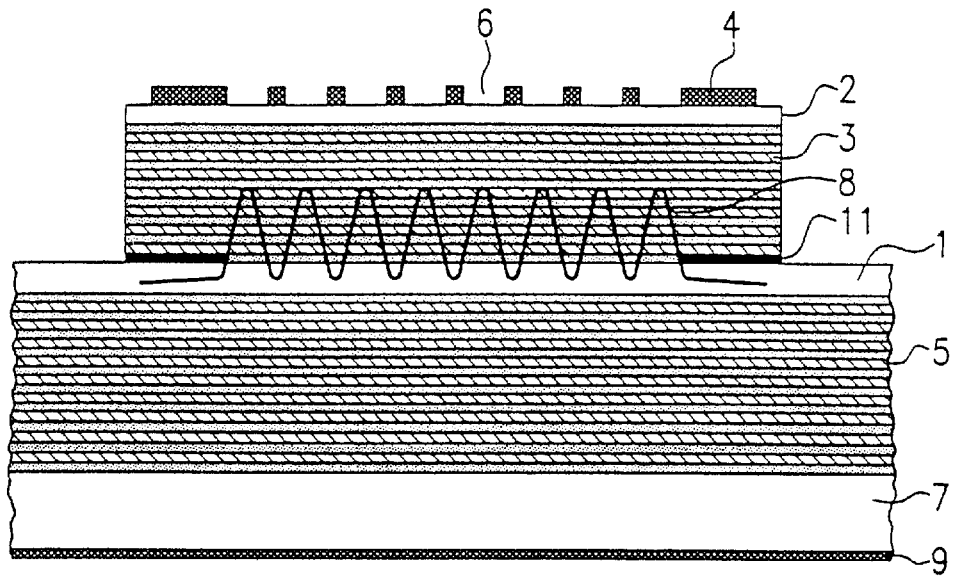
FIG. 1 is a schematic cross-sectional view of an embodiment of the present invention.
Figure 5:
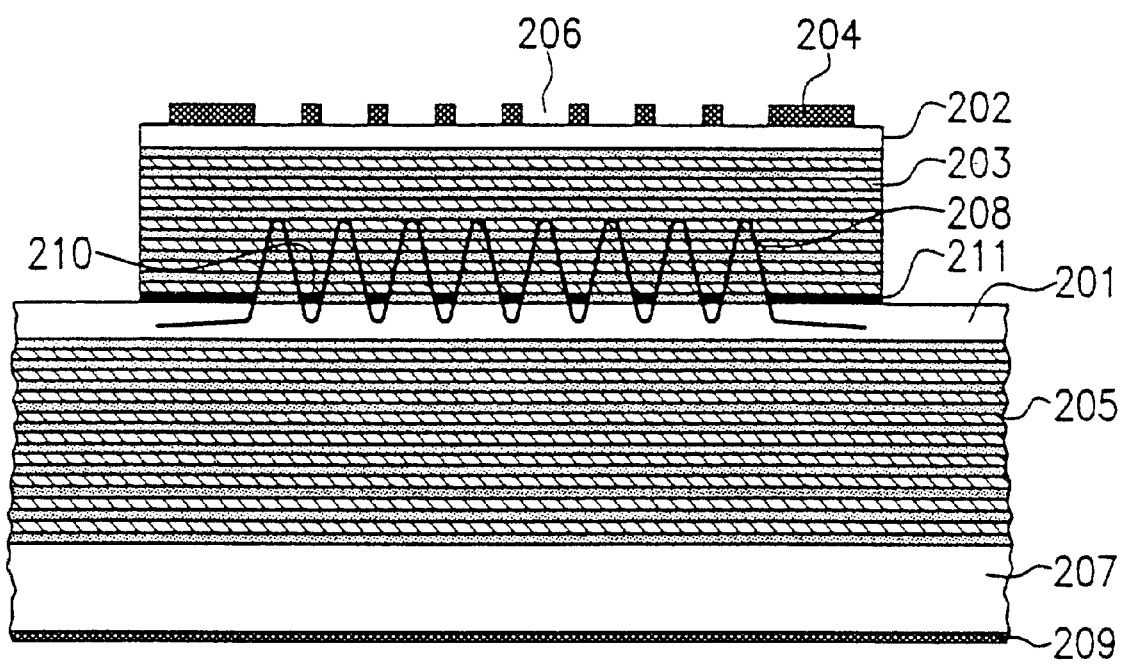

FIGS. 3a to 3e schematically depict various geometric structures of the grid layer;

FIGS. 4a to 4c schematically depict the geometric structure of the grid layer according to a further embodiment of the present invention;

FIG. 4d shows a schematic cross-sectional view of the embodiment as shown in FIG. 4c; and FIG. 5 is a schematic cross-sectional view of a further embodiment of the present invention which is similar to the device as shown in FIG. 1.

FIG. 1 shows a schematic cross-sectional view of an embodiment of a VCSEL device according to the present invention. In FIG. 1, the bottom surface of a substrate layer 7 is covered by a metal layer 9. Over the substrate layer 7 a laser active region 1 is formed. Active region 1 is disposed between second mirror means 5 formed over substrate layer 7, and first mirror means 3. First and second mirror means 3, 5 are composed of distinct layers having alternatingly a high index of refraction and a low index of refraction. In this example, alternating layers of GaAs having a thickness of 68 nm and $Al_{0.9}Ga_{0.1}As$ having a thickness of 80 nm, are employed to form a resonator for an output wavelength of 960 nm, however, other material compositions are suitable as well. On top of first mirror means 3 a contact layer 2 is formed. On the contact layer 2, a grid layer 4 is formed, having a plurality of openings 6. The thickness of contact layer 2 is selected so as to provide the required variation in the reflectivity of the first mirror means 3, wherein the optical characteristics of the grid layer 4 having openings 6 are taken into account. In this embodiment, optical confinement of the radiation is achieved by firstly forming a mesa containing the first mirror means 3 and, secondly, by a resistance layer 11 formed by selective oxidation of the peripheral portion of a layer of high Al content during the formation of the mesa, thereby providing an electrically insulating portion in resistance layer 11.

In operation, an electric current is supplied to the active region 1 via grid layer 4 which is comprised of a stack of layers formed of Pt, Ti, Pt and Au, with respective thicknesses of 10 nm, 10 nm, 10 nm and 70 nm, and metal layer 9, so as to create a population inversion in the p-n junction of the active region 1. The composition of the grid layer 4 and the thickness of contact layer 2 is selected so as to obtain a high reflectivity below the openings 6 of the grid layer 4, which serve as radiation emission windows for the stimulated radiation. Below the regions which are covered by the grid layer 4, the reflectivity is remarkably reduced and, hence, the losses in these regions are increased so that the transverse radiation mode having an intensity maximum under the openings 6 is stabilized. A curve 8 in FIG. 1 schematically depicts an intensity variation of the corresponding transverse radiation mode.

Figure 2:
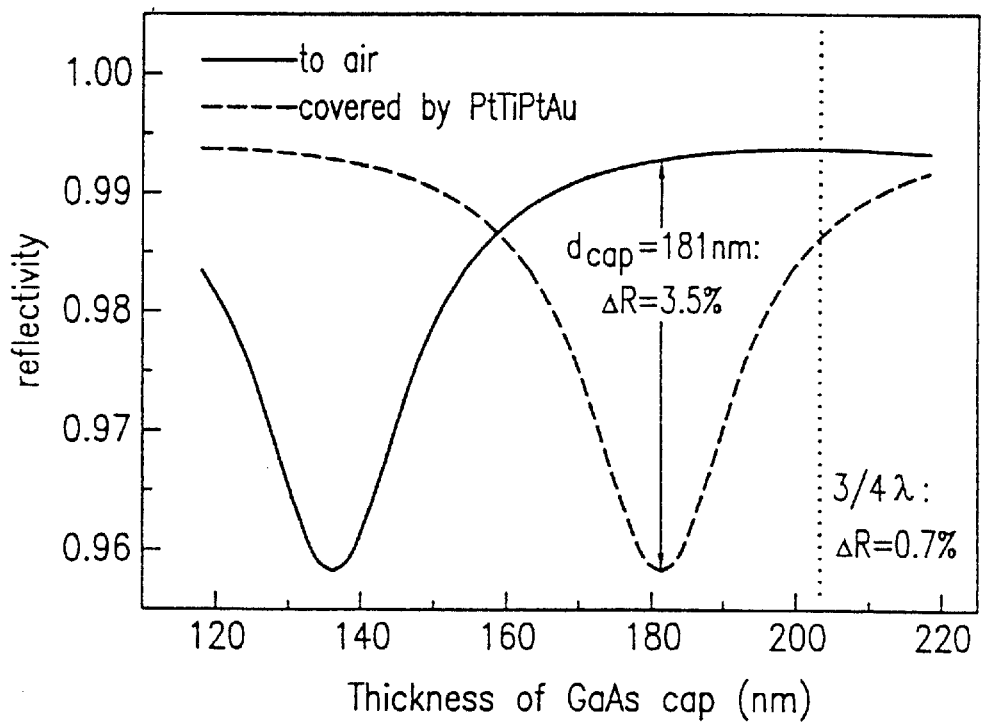
FIG. 2 is a graph showing the reflectivities of a Bragg mirror covered with a contact layer alone (solid line) and additionally with a grid layer composed of metal layers (broken line) with respect to the thickness of the contact layer.

In FIG. 2, there is shown a graph which illustrates the reflectivity of the combination of first mirror means 3, contact layer 2 and grid layer 4. In FIG. 2, the relative reflectivity of mirror means 3 is plotted versus the thickness of contact layer 2 which is, in this example, formed of GaAs. The solid line in FIG. 2 refers to the reflectivity below the openings 6 of the grid layer 4, wherein an interface from contact layer 2 to air contributes to the overall reflectivity. As can be seen from this curve, the maximum reflectivity is about 99.4% at an appropriate thickness of 190 nm. The minimum reflectivity is obtained at about 137 nm and amounts to about 95.7%. The dashed line in FIG. 2 represents the reflectivity under the portions which are covered by the grid layer 4 which is composed of Pt, Ti, Pt, and Au. As can be seen from this curve, the minimum reflectivity is located at a thickness of 181 nm and amounts to about 96%. As indicated in FIG. 2, a respective difference between the two reflectivities for a selected thickness of contact layer 2 can be determined. In this example, a difference of 3.5% is obtained at a thickness where the reflectivity below the grid layer 4 is minimized. Moreover, in FIG. 2, the vertical dotted line at about 203.7 nm represents the ¾ wavelength thickness of a corresponding cap layer which may be employed in conventional VCSEL devices. As shown in this Figure, the difference in the corresponding reflectivities is 0.7% and is, thus, significantly lower than that of the device according to the present invention. The results in FIG. 2 are determined by a calculation performed for a VCSEL structure for an output wavelength of 960 nm. The simulated top distributed Bragg reflector in the example consists of 21 pairs of alternating λ/4 layers of GaAs (67.9 nm) and $Al_{0.9}Ga_{0.1}As$ (79.8 nm). The thickness of the topmost GaAs layer (contact layer) was varied in the calculation, so as to find the final layer thickness where the reflectivity below the grid layer is most effectively suppressed. The reflectivity suppression is due to the phase mismatch of the reflective waves from the distributed Bragg reflector and the interface between the contact layer and the grid layer. In the calculation, the thicknesses of Pt, Ti, Pt, and Au are 10 nm, 10 nm, 10 nm, and 70 nm, respectively.

It should be noted that in FIG. 2, a thickness of contact layer 2 was selected which provides the maximum difference of the reflectivities. It may, however, be sufficient that the thickness of contact layer 2 is selected within a certain range around the minimum reflectivity in order to obtain the required reflectivity contrast. For many applications, a thickness of contact layer 2 within ±20 nm of the minimum may be appropriate. Furthermore, in this example, the calculations have been performed with the above-mentioned parameters, however, other parameters as well as other materials may be selected in accordance with design requirements.

The lateral patterning of the top mirror allows to select a single transverse supermode by increasing the cavity losses of the other modes. This can be seen from the following explanation. In a large area VCSEL, each of the many possible transverse modes must meet a modal threshold condition:

$$\Gamma g_{th}^{lm} = \alpha + \frac{1}{L}\ln\left(\frac{1}{R^{lm}}\right)$$

where Γ is a confinement factor of the radiation field (overlap of the radiation field with the gain region), $g_{th}^{lm}$ is the threshold gain of mode lm, α a wavelength-dependent loss factor, L the cavity length, and R the product of bottom mirror reflectivity times top mirror reflectivity for mode lm (l, m are mode indices). If, for all modes, Γ, l and α do not change, then the threshold gain of each mode is directly related to the modal reflectivity R. If no contact layer and grid layer in accordance with the present invention are provided, all modal reflectivities are the same, and strong mode competition (multimode emission) is observed. If at least one of the mirrors has a laterally varying reflectivity, the modal reflectivity can be calculated with the following equation:

$$R^{lm} = \int I^{lm}(x,y) \cdot R(x,y) \, dxdy,$$

where $I^{lm}(x,y)$ is the normalized radiation field intensity of mode lm at position (x,y). With a mirror having a laterally varying reflectivity, this overlap integral differs substantially for different lateral modes. In particular, if R (x,y) is largely reduced at the regions covered by the grid, for example, a square grid, every mode except the mode having intensity minima at locations coinciding with the grid coverage suffers from a depressed modal reflectivity. Accordingly, the mode with intensity minima on the grid is the "phase coupled array mode" or supermode, which lases with a phase shift of 180° with respect to neighboring VCSEL elements.

As a consequence, the usage of a contact layer having the correct thickness allows to largely increase the losses of the undesired modes and, hence, suppresses mode competition and stabilizes the supermode.

Figure 3B:
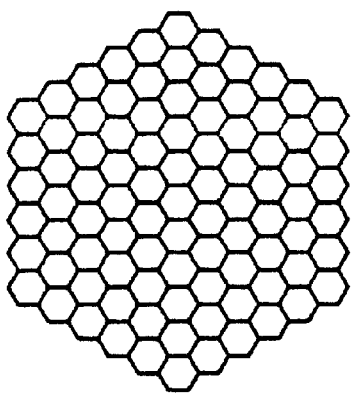
Figure 3A:
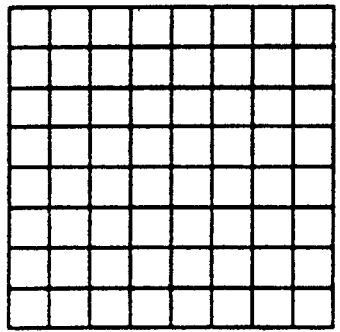

In FIGS. 3a to 3e, various geometric structures of the grid layer 4 are shown. In FIG. 3a, a square grid is shown in which a bar width of the grid, indicated as a black line in FIG. 3a, is approximately 1 μm and the dimension of the grid opening representing the radiation emission window is 4 μm. The far field beam of a VCSEL having the above-mentioned square grid comprises 4 beam spots.

FIG. 3b shows a honeycomb structure, wherein the openings are on a triangular lattice. A VCSEL device having this structure exhibits 6 far field beam spots.

Figure 3E:
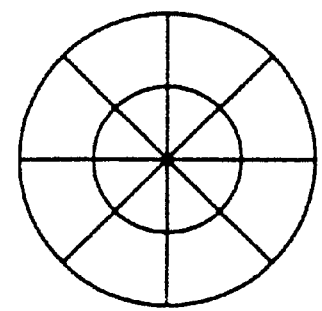
Figure 3D:
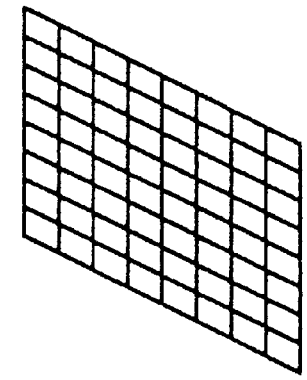
Figure 3C:
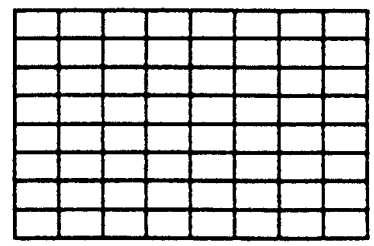

FIGS. 3c and 3d show a rectangular phase coupled array and a rhombic phase coupled array, respectively, wherein the electric fields of adjacent VCSEL elements in the rhombic array are decoupled when the tilt angle exceeds a certain value.

FIG. 3e shows an alternative arrangement containing concentric circles with dividing bars, wherein no transverse array mode is stabilized, but a radial symmetric mode in a circular VCSEL is preferred.

With reference to FIGS. 4a to 4d, a further embodiment of the present invention based on the honeycomb structure as shown in FIG. 3d is described.

FIG. 4a shows the phase conditions in the honeycomb structure, in which, as previously mentioned, the phase shift between adjacent VCSEL elements is 180°. This is indicated in FIG. 4a by a "0"for no phase shift and a "π" for a phase shift of 180°. As can be seen in FIG. 4a, however, there are VCSEL elements which are adjacent to both "π"-elements as well as "0"-elements. Accordingly, these elements indicated as white areas in FIG. 4a will not lase in a defined phase relationship to their neighboring VCSEL elements, since they do not "know" how to respond to the adjacent electric fields of different phase, i.e both 0° and 180°.

FIG. 4b is a schematic top view of the geometric structure as shown in FIG. 4a. Here, the VCSEL elements, which are not able to enter the transverse supermode due to the different phases of adjacent VCSEL elements 113 having alternatingly the phase difference of 180°, are indicated by reference numeral 114. In the center of non-lasing VCSEL element 114, a vertical opening 112 is formed by, for example, an appropriate etch process. Preferably, opening 112 extends beyond a certain layer having a high Al content so as to perform a selective oxidation process similar to that carried out when a mesa containing the top mirror is etched. The formation of the openings 112 does not disadvantageously affect the six nearest neighbor VCSEL elements 114.

FIG. 4c is a schematic top view of the structure shown in FIG. 4b and illustrates the results of the performed etch process and oxidation. Due to the selective oxidation process, the aluminum contained in said specific layer having the high aluminum content is oxidized into $Al_2O_3$ and forms a resistance layer 104 having a relatively high electric resistance. The horizontal extension of resistance layer 104, i.e. the radius of resistance layer 104 in FIG. 4c, depends on the initial aluminum contents and the parameters of the etch process and oxidation. Moreover, resistance layer 104 may provide for an additional optical confinement.

FIG. 4d is a schematic cross-sectional view taken along the line IVd in FIG. 4c. In FIG. 4d, an active region 107 is sandwiched between a bottom Bragg reflector 106 and a top Bragg reflector 105. On the top Bragg reflector 105 a contact layer 111 is provided, which, in turn, is partly covered by a grid layer 108. The composition and the thickness of grid layer 108 and the thickness of contact layer 111 are selected so as to yield a minimum reflectivity of the top Bragg reflector 105 in regions below the grid layer 108 as previously discussed. Due to the presence of the resistance layer 104 having a high electric resistance, a flow of charge carriers 110 is deflected so as to yield an enlarged current through the portions of the active region 107 which belong to the lasing VCSEL elements 114. This results in an increased optical gain, an improved efficiency of the VCSEL device and a significantly reduced heat development in the active region 107.

With reference to FIG. 5, a further preferred embodiment is now described. FIG. 5 is a schematic cross-sectional view of a VCSEL device similar to that shown in FIG. 1, and like parts in the VCSEL device are indicated by like reference numerals but increased by 200. The description and explanation of these parts is omitted. Differences between the two embodiments reside in the fact that the embodiment of FIG. 5 comprises a grid matching resistance layer 211 having additional resistance areas 210. The resistance areas 210 are arranged so as to coincide with the structure of a grid layer 204. The grid matching resistance layer 211 may be formed by selective oxidation or by any other suitable deposition and patterning process known in the art. Since the resistance areas 210 exhibit a high electrical resistance, the current flow of the charge carriers through an active region 201 is deflected so as to concentrate in those portions of active region 201 which correspond to grid openings 206. Since a high current density in regions of high reflectivity is desired, the current concentration in these regions considerably improves the gain of the laser device by increasing the conversion efficiency and reducing losses of the device which are effected by current flows through noncontributing portions of the active region 201.

The present invention has been described with reference to preferred embodiments in which a VCSEL device comprises a mesa and emits a laser beam through the top Bragg reflector. The contact layer and the grid layer having the features as previously discussed, however, may be incorporated in any kind of VCSEL device, such as selectively oxidized VCSELs, simple mesa-etched VCSELs, proton-implanted VCSELs, and bottom-emitting VCSELs. Furthermore, the present invention may advantageously be combined with any further feature that enhances the reflectivity of the mirrors. This may, for example, be obtained by depositing Au' on the top surface of VCSEL elements in the case of a bottom emitter, or by means of additional dielectric mirror pairs on top of the grid layer for a top emitter.

What is claimed is:

1. A vertical-cavity surface-emitting laser (VCSEL) device comprising a plurality of VCSEL elements arranged on a common substrate, each VCSEL element comprising first minor means and second mirror means, each having a predefined reflectivity at a predetermined wavelength, for forming an optical resonator for said wavelength, a laser active region disposed between said first and said second mirror means, and a grid layer arranged over said first mirror means, said grid layer having a plurality of openings corresponding to the respective VCSEL elements, wherein said VCSEL device further comprises a contact layer having a predetermined thickness, said contact layer being interposed between each of said first mirror means and said grid layer, wherein an optical thickness of said contact layer in combination with a reflectivity and an absorption of said grid layer is selected so as to provide an effective reflectivity of each of said first mirror means depending on said grid layer and being different for areas covered by the grid and areas corresponding to said grid openings.

2. The VCSEL device of claim 1, wherein said first and second mirror means are provided as Bragg reflectors common to all of said VCSEL elements.

3. The VCSEL device of claim 1, wherein said thickness of said contact layer is adjusted such that the reflectivity of said first mirror means is reduced in areas covered by the grid, compared to areas corresponding to said grid openings.

4. The VCSEL device according to claim 3, wherein the thickness of said contact layer is adjusted so as to obtain the minimum reflectivity of said areas covered by said grid layer for a given composition of the first mirror means and said grid layer.

5. The VCSEL device according to claim 1, wherein said grid layer comprises more than one layer, each of said layers consisting of a material having a defined index of refraction, a defined absorption coefficient and a defined thickness.

6. The VCSEL device according to claim 1, wherein said areas not. covered by said grid layer form radiation emission windows of respective elements for a radiation of said wavelength.

7. The VCSEL device according to claim 6, wherein an extension of each of said radiation emission windows is arranged to select substantially a fundamental transverse radiation mode of said radiation.

8. The VCSEL device according to claim 1, wherein the absolute reflectivity of said first and second mirror means in conjuncton with said contact layer is selected so as to obtain the minimum reflectivity required to generate stimulated emission.

9. The VCSEL device of claim 1,wherein said grid layer comprises at least one metal layer.

10. The VCSEL device according to claim 1, wherein said grid layer comprises a doped dielectric layer.

11. The VCSEL device of claim 3, wherein said reflectivity of said first mirror means in areas covered by the grid is reduced by at least 3% compared to the reflectvity of said first mirror means in areas corresponding to said grid openings.

12. The VCSEL device of claim 1, wherein said grid layer is a raster of squares or rectangles.

13. The VCSEL device of claim 1, wherein said grid layer is a rhombic raster.

14. The VCSEL device of claim 1, wherein said grid layer is a honeycomb raster.

15. The VCSEL device of claim 1, wherein a bar width of said grid layer is less than 10 $\mu$m.

16. The VCSEL device of claim 1, wherein a maximum horizontal dimension of each radiation emission window of said VCSEL element is in the range of 2 $\mu$m to 10 $\mu$m.

17. The VCSEL device of claim wherein a resistance layer is provided in which at least one region corresponding to an opening of said honeycomb raster has a high electrical resistance and said at least one high resistance region has six nearest-neighbor-regions.

18. The VCSEL device of claim awherein said high resistance region comprises an exposed portion where at least the overlying layers of said active region and of the Bragg mirror have a vertical opening.

19. The VCSEL device of claim 1, wherein a grid matching resistance layer is provided between said first mirror means and said laser active region, said grid matching resistance layer having a high electrical resistance at least in areas corresponding to areas covered by said grid layer.

* * * * *

UNITED STATES PATENT AND TRADEMARK OFFICE
CERTIFICATE OF CORRECTION

PATENT NO. : 6,507,595 B1
DATED : January 14, 2003
INVENTOR(S) : Elyahou Kapon et al.

It is certified that error appears in the above-identified patent and that said Letters Patent is hereby corrected as shown below:

Column 8,
Line 51, please change "first minor" to -- first mirror --.

Column 9,
Line 23, please change "substantally" to -- substantially --.

Column 10,
Line 18, please change "claim wherein" to -- claim 15, wherein --.
Line 23, please change "claim awherein" to -- claim 18, wherein --.

Signed and Sealed this

Eighth Day of July, 2003

JAMES E. ROGAN
*Director of the United States Patent and Trademark Office*